United States Patent [19]

Hayata

[11] Patent Number: 5,726,739
[45] Date of Patent: Mar. 10, 1998

[54] PROJECTION EXPOSURE APPARATUS AND DEVICE MANUFACTURING METHOD USING THE SAME

[75] Inventor: Shigeru Hayata, Utsunomiya, Japan

[73] Assignee: Canon Kabushiki Kaisha, Tokyo, Japan

[21] Appl. No.: 329,072

[22] Filed: Oct. 25, 1994

[30] Foreign Application Priority Data

Oct. 27, 1993 [JP] Japan .................... 5-291419
Sep. 13, 1994 [JP] Japan .................... 6-247213

[51] Int. Cl.⁶ .......................... H01L 21/27; G03B 27/32; G03B 27/54; G03F 7/20
[52] U.S. Cl. .................. 355/67; 355/53; 356/399; 356/400; 356/401; 250/548
[58] Field of Search ............... 355/53, 67, 77, 355/69; 250/201.1; 359/618, 619, 638–640; 356/399, 400, 401

[56] References Cited

U.S. PATENT DOCUMENTS

| | | | |
|---|---|---|---|
| 4,589,769 | 5/1986 | Matsuki | 355/71 |
| 4,947,030 | 8/1990 | Takahashi | 250/201.1 |
| 5,305,054 | 4/1994 | Suzuki et al. | 355/53 |
| 5,345,292 | 9/1994 | Shiozawa et al. | 355/67 |
| 5,367,404 | 11/1994 | Hayata | 359/558 |
| 5,463,497 | 10/1995 | Muraki et al. | 359/618 |

*Primary Examiner*—R. L Moses
*Assistant Examiner*—Shival Virmani
*Attorney, Agent, or Firm*—Fitzpatrick, Cella, Harper & Scinto

[57] ABSTRACT

A projection exposure apparatus includes a secondary light source forming device having a light entrance surface and a light exit surface, for receiving light from a light source with the light entrance surface and for forming a secondary light source at the light exit surface side, a light projecting system for projecting light from the secondary light source to an object plane, a pattern projecting system for projecting, onto an image plane, a pattern on the object plane irradiated with the light, a secondary light source adjusting device for changing a light intensity distribution of the secondary light source, and an illuminance correcting device for substantially correcting illuminance non-uniformness, asymmetric with respect to an optical axis, formed or to be formed on the image plane with the change of the light intensity distribution.

49 Claims, 11 Drawing Sheets

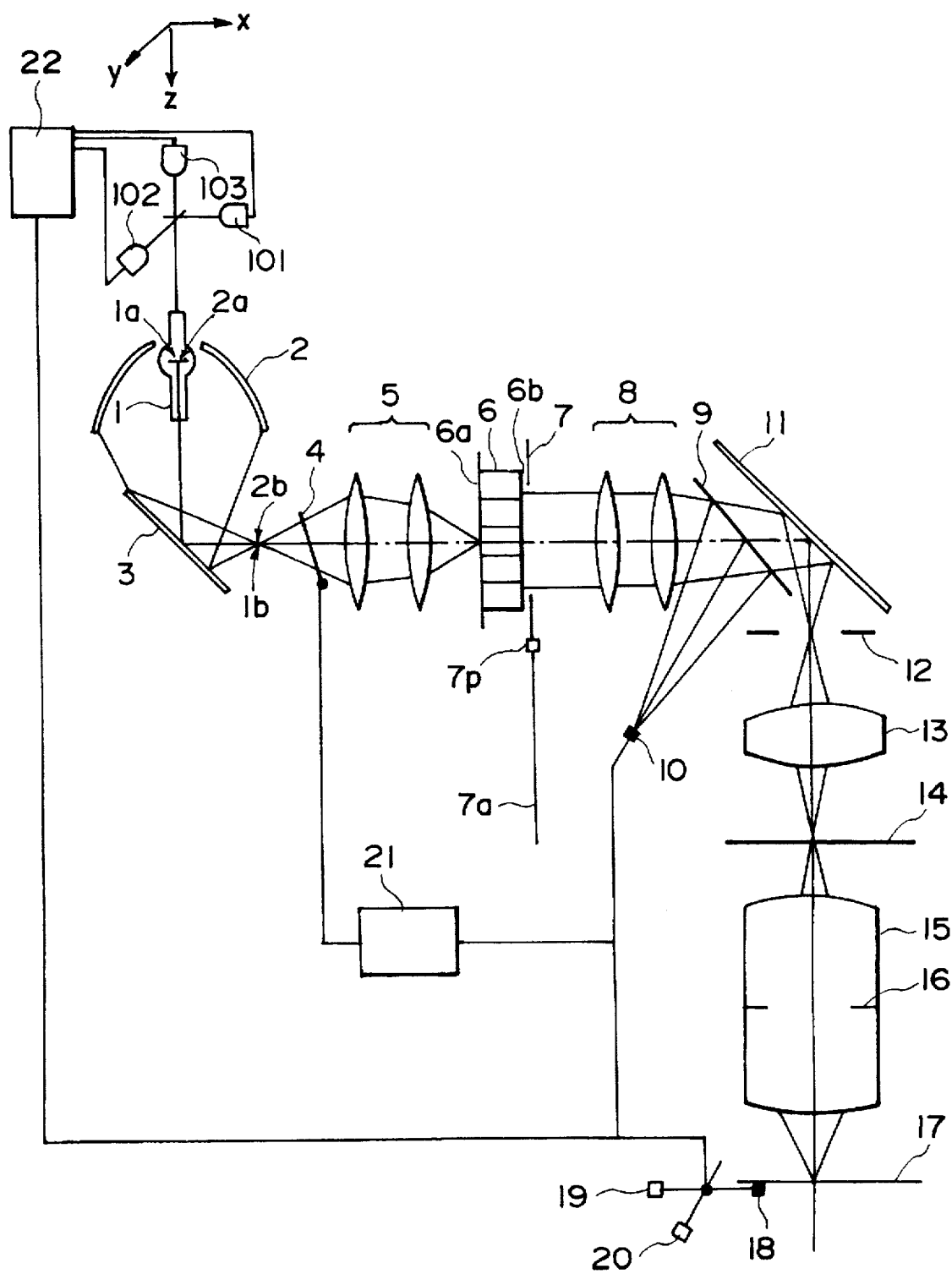
F I G. 1

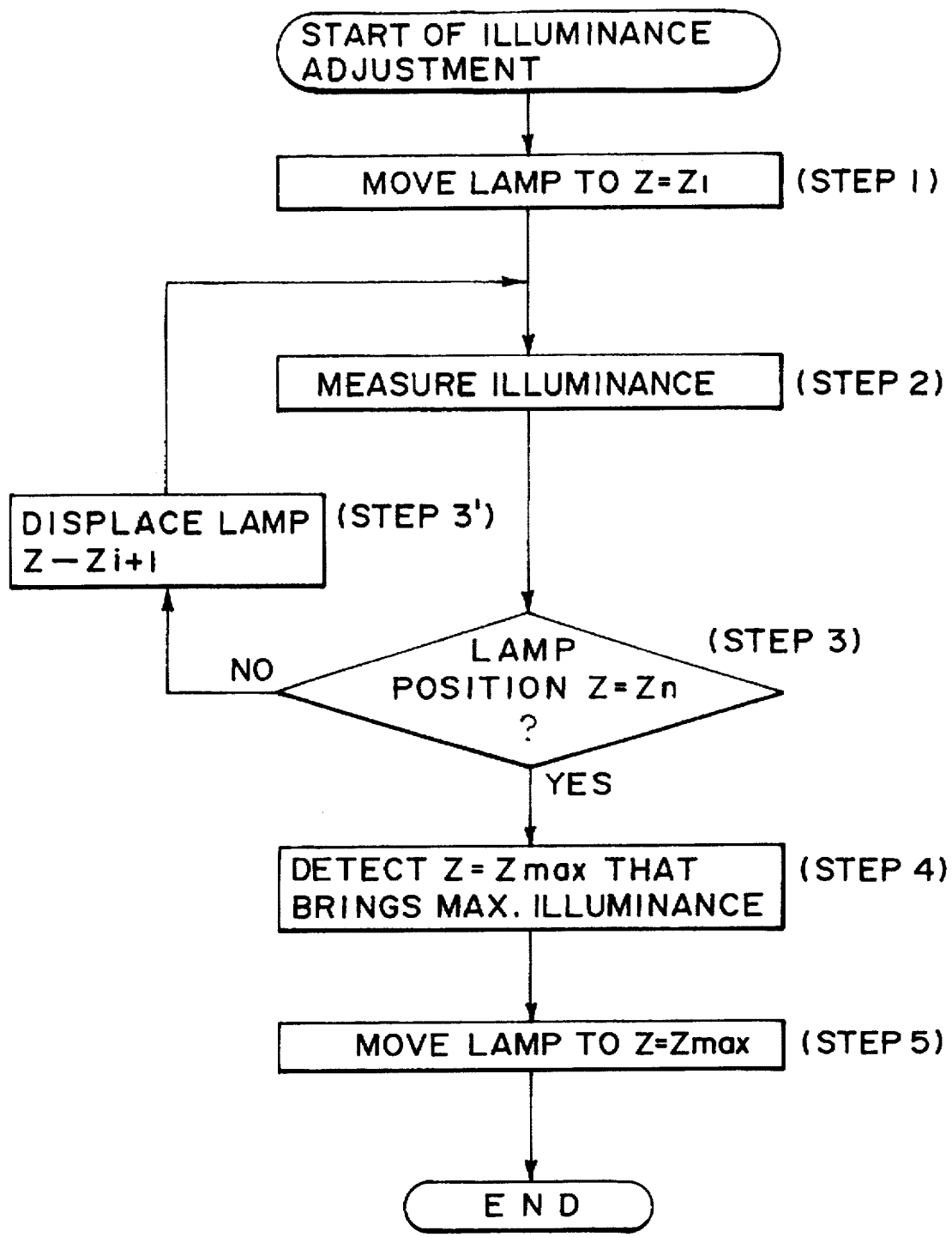
F I G. 3

PROJECTION EXPOSURE APPARATUS AND DEVICE MANUFACTURING METHOD USING THE SAME

FIELD OF THE INVENTION AND RELATED ART

This invention relates to a projection exposure apparatus and a device manufacturing method using the same. More particularly, the invention is concerned with such an apparatus and a method suitably applicable to the manufacture of micro-structure devices such as ICs, LSIs, magnetic heads, liquid crystal panels or CCDs.

Semiconductor chip producing technology as well as fine machining technology have been advanced remarkably. Particularly, optical machining technology has attained sub-micron resolution in relation to the production of 1 MDRAM semiconductor chips.

In many cases, for higher resolution, a larger numerical aperture (N.A.) is used while keeping the exposure wavelength fixed. In recent attempts, however, exposure wavelength of i-line is used in place of g-line to improve the resolution. Also, proposals have been made to use light having a shorter wavelength, such as light from a KrF excimer laser, for example, to attain improved resolution.

U.S. Pat. No. 5,305,054 assigned to the assignee of the subject application proposes an exposure method and a projection exposure apparatus using the same wherein, for attaining improved resolution, the manner of illuminating a reticle is changed, that is, the light intensity distribution (effective light source distribution) of zeroth order light defined on a pupil of a projection optical system is changed.

Semiconductor chip manufacturing processes include those processes wherein high resolution is required and those processes wherein not so high a resolution is required. Also, a reticle has different patterns: patterns extending longitudinally, patterns extending transversely and patterns extending obliquely.

Generally, the effective light source distribution (light intensity distribution) upon a pupil of a projection optical system has a large effect on the resolution of a pattern to be projected. Based on this, a proposal has been made to provide a current semiconductor chip manufacturing projection exposure apparatus with an illumination system having different illumination modes so as to assure optimum illumination of a reticle in every process. In this method, in a particular illumination mode (mode A) of the different illumination modes, the position of a light emitting portion of a light source is so adjusted to attain maximum illuminance with minimum illuminance non-uniformness. However, when the illumination mode is changed to another illumination mode (mode B) different from the mode A, the maximum illuminance and minimum illuminance non-uniformness are not always attained with the same position of the light emitting portion as in the mode A. This means that in the mode A, the exposure apparatus shows good performance with respect to the illuminance and the illuminance non-uniformness but, in the mode B, it does not show good performance with respect to these points.

Particularly, in a case where the illumination mode A is such that σ is large (0.6–0.7) under ordinary conditions and the illumination mode B is such that σ is small (0.3–0.4) using a phase shift mask, there occurs a problem of a large decrease of light quantity in the illumination mode B.

SUMMARY OF THE INVENTION

It is an object of the present invention to provide a projection exposure apparatus or a device manufacturing method by which, even when the illumination mode is changed from the mode A to the mode B, maximum illuminance or minimum illuminance non-uniformness is still held to assure high-resolution projection of different patterns of a reticle upon a wafer.

In accordance with a first aspect of the present invention, there is provided a projection exposure apparatus, comprising: secondary light source forming means having a light entrance surface and a light exit surface, for receiving light from a light source with said light entrance surface and for forming a secondary light source at the light exit surface side; light projecting means for projecting light from the secondary light source to an object plane; pattern projecting means for projecting, onto an image plane, a pattern on the object plane irradiated with the light; secondary light source adjusting means for changing a light intensity distribution of the secondary light source; and illuminance correcting means for substantially correcting illuminance non-uniformness, asymmetric with respect to an optical axis, formed or to be formed on the image plane with the change of the light intensity distribution.

In accordance with a second aspect of the present invention, there is provided a projection exposure apparatus, comprising: secondary light source forming means having a light entrance surface and a light exit surface, for receiving light from a light source with said light entrance surface and for forming a secondary light source at the light exit surface side; light projecting means for projecting light from the secondary light source to an object plane; pattern projecting means for projecting, onto an image plane, a pattern on the object plane irradiated with the light; secondary light source adjusting means for changing a light intensity distribution of the secondary light source; and illuminance adjusting means for substantially increasing the quantity of the light projected or to be projected to the object plane, the quantity being decreased or to be decreased with the change of the light intensity distribution.

In accordance with a third aspect of the present invention, there is provided a projection exposure apparatus, comprising: secondary light source forming means having a light entrance surface and a light exit surface, for receiving light from a light source with said light entrance surface and for forming a secondary light source at the light exit surface side; light projecting means for projecting light from the secondary light source to an object plane; pattern projecting means for projecting, onto an image plane, a pattern on the object plane irradiated with the light; secondary light source adjusting means for changing a light intensity distribution of the secondary light source; and illuminance adjusting means for substantially correcting illuminance non-uniformness, asymmetric with respect to an optical axis, formed or to be formed on the image plane with the change of the light intensity distribution, and also for substantially increasing the quantity of the light projected or to be projected to the object plane, the quantity being decreased or to be decreased with the change of the light intensity distribution.

In a fourth aspect of the present invention, there is provided a device manufacturing method which includes a step of projecting and transferring a device pattern of a reticle onto a substrate through a projection exposure apparatus according to one of the first to third aspects of the present invention as described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a main portion of a projection exposure apparatus according to a first embodiment of the present invention.

FIG. 3 is a flow chart, showing the sequence of illuminance adjustment in the first embodiment.

DESCRIPTION OF THE PREFERRED EMBODIMENTS

Figure 2A:
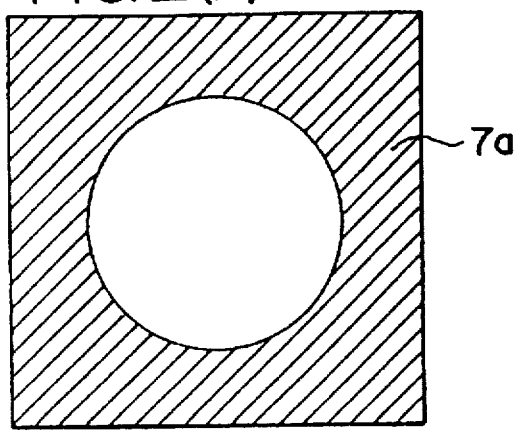
FIGS. 2(A)–2(D) are schematic views each for explaining a variable aperture of the FIG. 1 apparatus.

FIG. 1 is a schematic view of a main portion of a first embodiment of the present invention.

Denoted at 2 in the drawing is an elliptical mirror and at 1 is a light emitting tube (light source) having a high-luminance light emitting portion 1a for emitting ultraviolet rays and/or deep ultraviolet rays. The light emitting portion 1a is disposed in the vicinity of a first focal point 2a of the elliptical mirror 2. Denoted at 3 is a cold mirror having a multilayered film, for transmitting most of the infrared light as well as the visible light of the light from the light emitting portion 1a and for reflecting most of the ultraviolet light. Through the cold mirror 3, the elliptical mirror 2 forms an image (light source image) 1b of the light emitting portion 1a in the vicinity of a second focal point 2b.

Denoted at 4 is a shutter device which is used to control the exposure time. Denoted at 5 is an optical system which comprises a condenser lens and a zoom lens, for example. It serves to re-image the light emitting portion image 1b, formed adjacent to the second focal point 2b, upon a light entrance surface 6a of an optical integrator 6. The imaging magnification can be changed by the zoom lens.

In this embodiment, the magnification for re-imaging the light emitting portion image 1b is changed in accordance with the aperture diameter of an aperture stop (stop) 7 to assure good light utilization efficiency.

The optical integrator 6 comprises a plurality of small lenses 6i (i=1–N) disposed two-dimensionally along a plane perpendicular to the optical axis, with a predetermined pitch. Thus, it is a fly's eye lens and serves to form a secondary light source in the vicinity of its light exit surface 6b.

Denoted at 7 is a variable aperture stop. It has different types of stops such as illustrated in FIGS. 2(A)–2(D), including an ordinary circular stop, for changing a light intensity distribution on a pupil 16 of a projection lens 15.

Figure 2C:
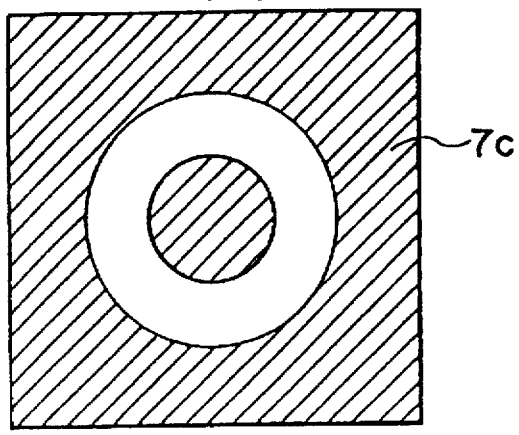
Figure 2B:
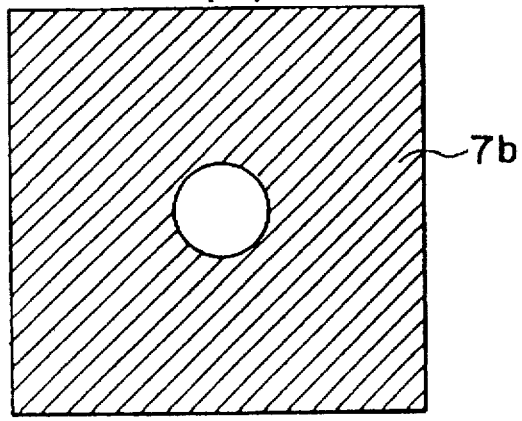
Figure 2D:
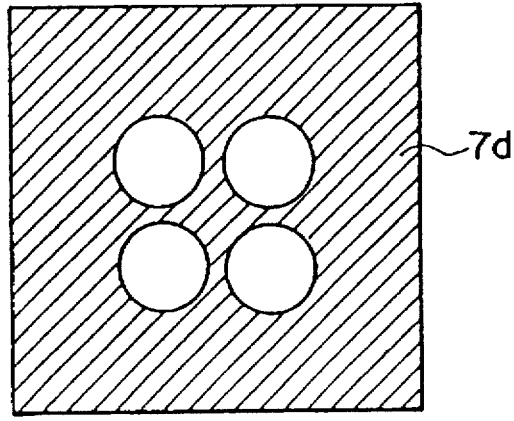

The one shown in FIG. 2(A) is an aperture stop used normally. The aperture diameter is of a size with which a σ value (=NA1/NA2: NA1 is the N.A. of an illumination optical system and NA2 is the N.A. of a projection optical system) of about 0.5–0.7 is provided. The stop shown in FIG. 2(B) is an aperture stop having an aperture diameter with which a σ value of about 0.3–0.4 is provided. This is used in combination with a phase shift mask. The stop shown in FIG. 2(C) is an aperture stop for ring illumination. The stop shown in FIG. 2(D) is an aperture stop for quadruple illumination. These two stops are examples for performing modified illumination for improving the resolution and the depth of focus.

In this embodiment, any one of the stops 7a, 7b, 7c and 7d is used selectively as the aperture stop 7, to thereby change the illumination mode. To this end, a disk-like turret having the aperture stops 7a–7d formed therein is used.

Denoted at 7p is an actuator for rotating the turret to change the stop 7. Denoted at 8 is a condenser lens (light collecting lens). It has a movable lens for correcting illuminance non-uniformness, being symmetrical with respect to the optical axis, to be produced in response to the change of illumination mode. A movable lens of the type shown in U.S. Pat. No. 4,947,030 is applicable to this movable lens. Denoted at 9 is a half mirror for reflecting a portion (a few percentages) of received light toward a light measuring device 10. The light measuring device 10 is placed in a substantially optically conjugate relation (mirror image relation) with a masking blade 12, and it serves to measure the illuminance upon the aperture plane of the blade 12. The illuminance data (light quantity data) from the light measuring device 10 is supplied into a control device 21. In response, a signal is applied from the control device 21 to the shutter device 4 by which the closing motion or speed of the shutter is controlled.

A plurality of lights emanating from the secondary light source, formed in the vicinity of the light exit surface 6b of the optical integrator 6, are collected by the condenser lens 8. The collected light is reflected by a mirror 11 toward the masking blade 12, whereby the aperture plane of the masking blade 12 is illuminated uniformly. The masking blade 12 comprises a plurality of movable blocking blades effective to variably define an aperture of a desired shape. U.S. Pat. No. 4,589,769 shows a specific structure which is applicable to this masking blade 12.

Denoted at 13 is an imaging lens for imaging the aperture of the masking blade 12 upon the surface of a reticle 14 (the surface to be illuminated), by which an appropriated region of the reticle 14 surface is illuminated uniformly.

Denoted at 15 is a projection optical system which comprises a lens system. It serves to project, in a reduced scale, a circuit pattern formed on the reticle 14 surface upon a wafer (substrate) 17 placed on a wafer chuck. The projection optical system may comprise a cata-dioptric system, for example, including a projection mirror as well as a dioptric system.

Denoted at 16 is a pupil (stop) of the projection optical system 15. Denoted at 18 is a photodetector which comprises an ultraviolet ray detector, for example. The detector 18 is so disposed that its light receiving surface is substantially coplanar with the wafer 17. By means of actuators 19 and 20, it can be moved two-dimensionally along the image plane to measure the illuminance and the illuminance non-uniformness upon the image plane. The detector 18 may be disposed on the plane on which the reticle is placed, the plane being optically conjugate with the plane on which the wafer 17 is placed.

In the optical arrangement of this embodiment, the light emitting portion $1b$ and the second focal point $2b$ as well as the light entrance surface $6a$ of the optical integrator 6 are disposed in a substantially optically conjugate relationship. Also, the masking blade 12 and the reticle 14 as well as the wafer 17 are placed in a substantially optically conjugate relationship. Further, the stop 7 and the pupil plane 16 of the projection optical system 15 are placed in a substantially optically conjugate relationship.

With the arrangement of the present embodiment described above, the circuit pattern on the reticle 14 surface is projected upon the wafer 17 surface in a reduced scale, such that the wafer 17 is exposed to the circuit pattern image. Through a subsequent predetermined development process and other processes, semiconductor devices are produced.

Now, the structure of the present embodiment for adjusting the position of the light emitting portion $1a$ of the light source 1 in response to a change of the illumination mode with the change of the aperture shape of the stop 7, for maintaining good illumination efficiency as well as good uniformness of illuminance, will be explained.

In FIG. 1, denoted at 101 is an actuator for adjusting the position of the light source 1 with respect to the Y direction. Denoted at 103 is an actuator for adjusting the position of the light source 1 with respect to the Z direction (the position in the optical axis direction). The initial adjustment of the light source 1 is initially done with respect to any one (mode A) of different illumination modes selectable. When the illumination mode is changed to another (mode B), the measuring device 18 is used to measure the illuminance and the illuminance non-uniformness. Also, through the control device 22, the position of the light source 1 is adjusted so as to assure maximum illuminance and minimum illuminance non-uniformness, to change the intensity distribution of light impinging on or going to impinge on the optical integrator 6.

The illuminance adjustment is done by moving the light source 1 in the Z direction while fixing the detector 18 at an arbitrary position on the image plane (e.g., the center of the exposure region), to determine the maximum illuminance point. In this case, the measuring device 10 may be used to measure the illuminance, in place of using the measuring device 18.

The illuminance adjustment of the present embodiment may be done in accordance with the sequence of the flow chart of FIG. 3, for example. Namely, the Z-axis adjustment range of the light source 1 may be divided into n; the illuminance at each point may be measured; and the maximum illuminance ZMAX may be determined. The flow chart of FIG. 3 will be explained below.

[Step 1]

Moving the light source 1 in the Z direction to Z=Z1.

[Step 2]

Illuminance measurement.

[Step 3]

The sequence goes to step 4 if the light source 1 reaches the position Z=Zn. The sequence goes to step 3' if Z<Zn.

[Step 4]

Figure 4:
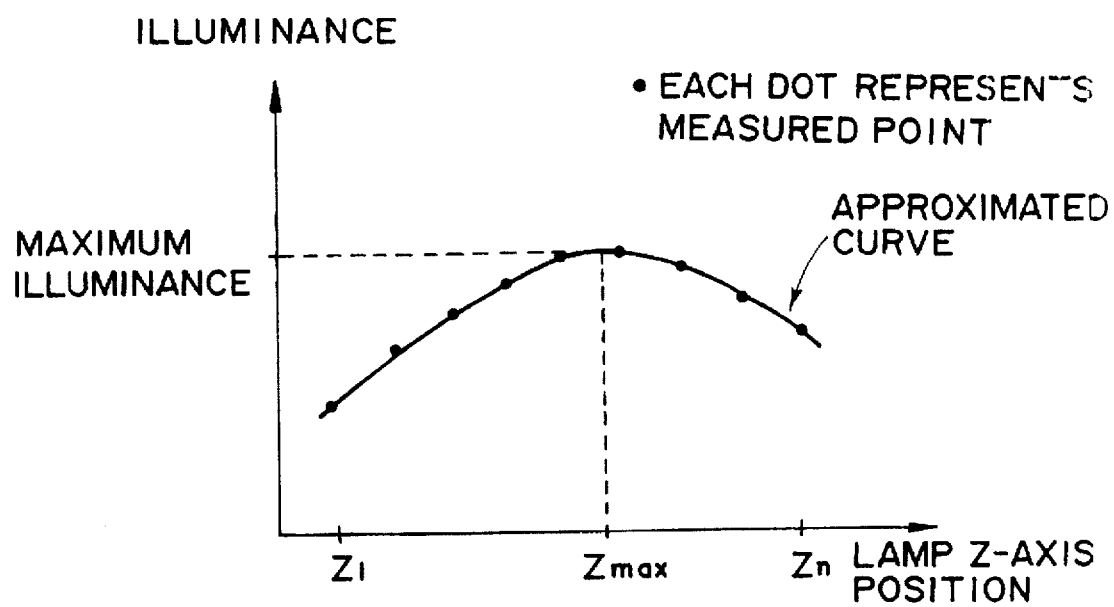
FIG. 4 is a graph for explaining the relation between the illuminance and the Z-axis position of the light source 1 of the FIG. 1 embodiment.

Determining the position ZMAX of the light source in the Z direction, attaining the maximum illuminance. As an example, the ZMAX position may be determined as follows: The illuminances at positions Z1–Zn of the light source 1 may be plotted in a graph such as that of FIG. 4. On the basis of these measuring points, an approximated curve may be determined through a least square method, for example. The maximum illuminance position ZMAX may be determined by this approximated curve.

[Step 5]

Moving the Z axis position of the light source 1 to Z=ZMAX.

Figure 5:
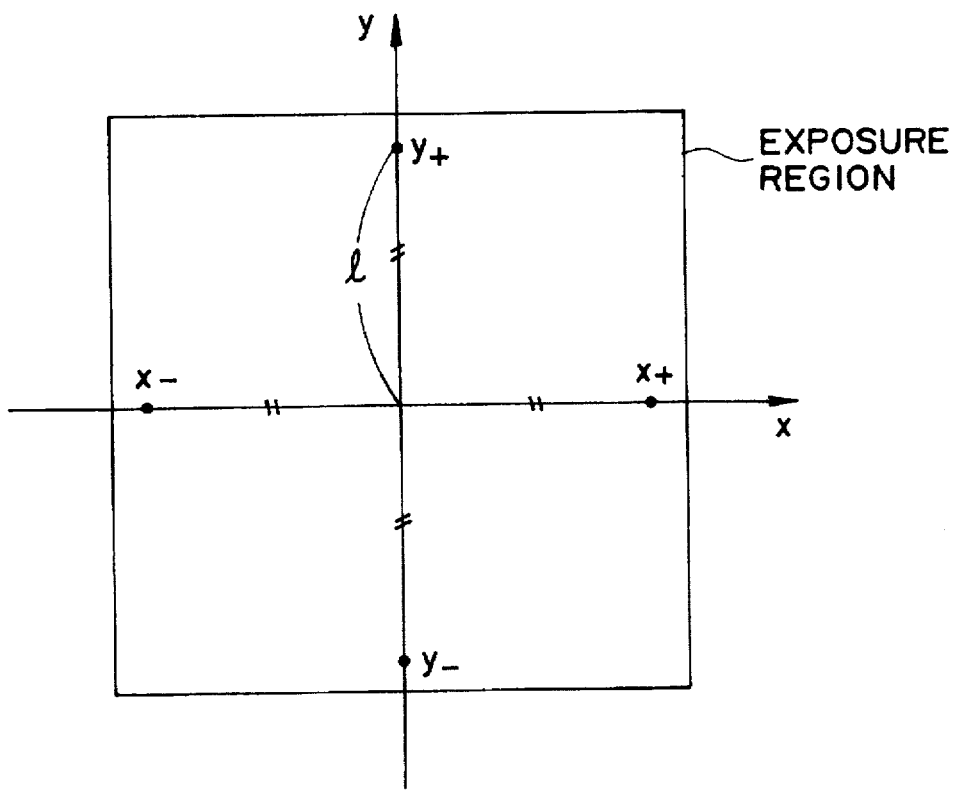
FIG. 5 is a graph for explaining illuminance measurement points on the image plane, for correction of illuminance non-uniformness in the first embodiment.

For adjustment of asymmetric illuminance non-uniformness, the position of the light source 1 is adjusted with respect to the X and Y directions. This is done in the following sequence:

FIG. 5 illustrates the exposure region. In the coordinate system of FIG. 5, the origin is taken on the optical axis, and the X axis and Y axis correspond to the X axis and Y axis of the light source 1 of FIG. 1. The coordinates of the points $Y_+$, $Y_-$, $X_+$ and $X_-$ are:

(0, 1), (0, –1), (1, 0) and (–1, 0)

respectively. These points are on the Y and X axes, respectively, and are symmetric with each other with respect to the origin. The length 1 may desirably be of a size close to the periphery of the exposure region.

Figure 6:
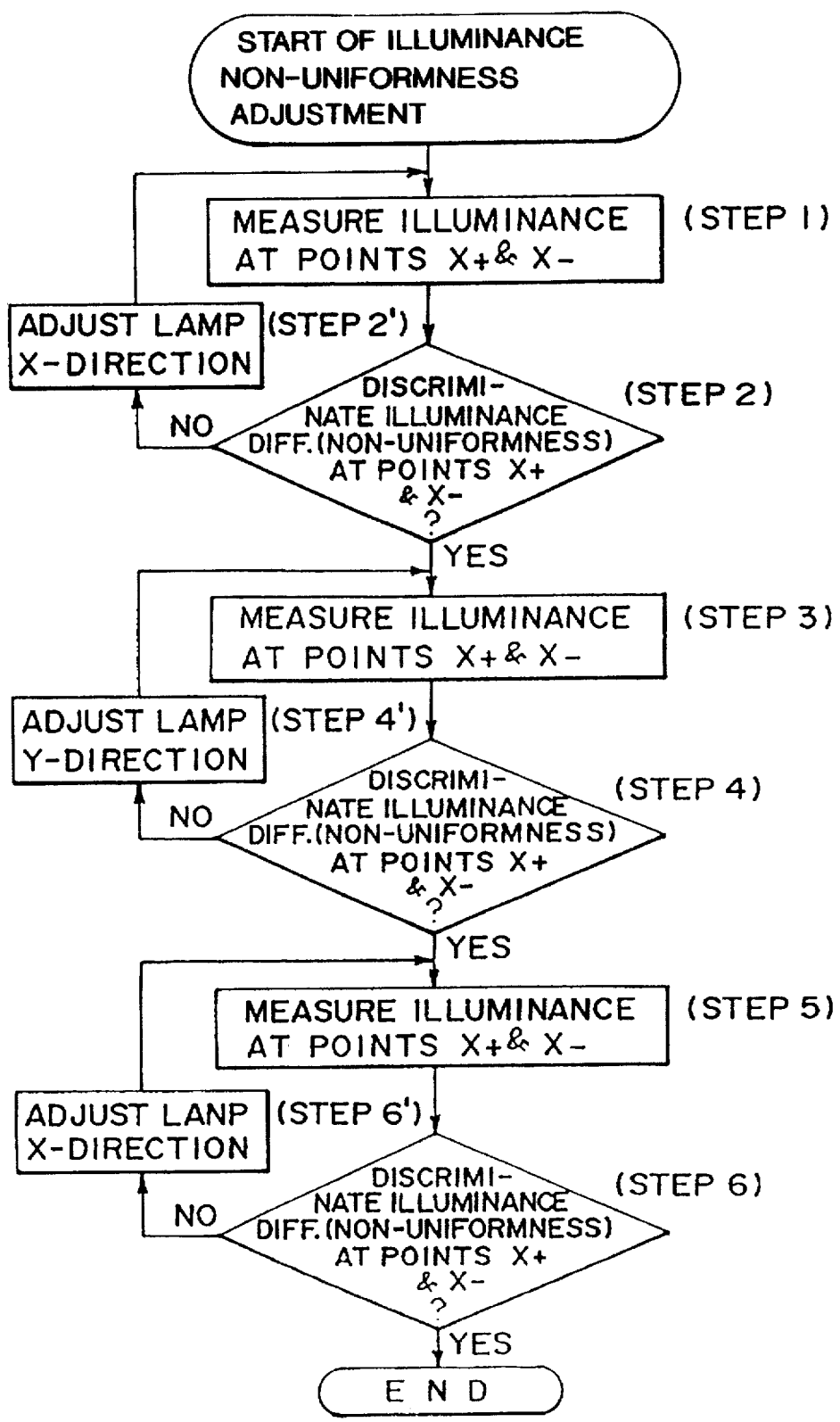
FIG. 6 is a flow chart of the sequence of illuminance non-uniformness adjustment in the first embodiment.

FIG. 6 is a flow chart of the sequence of X-axis and Y-axis adjustment of the light source 1.

[Step 1]

Measuring the illuminances at two points $X_+$ and $X_-$ on the X axis.

[Step 2]

Discriminating the difference (non-uniformness) between the illuminances at the points $X_+$ and $X_-$. If ILX1–ILX2 $\geq \gamma 1$ (ILX1 is the illuminance at the point $X_+$, ILX2 is the illuminance at the point $X_-$ and $\gamma 1$ is the threshold of the illuminance difference with respect to the X direction), the sequence goes to Step 2' and the position of the light source 1 is displaced and adjusted in the X direction. If ILX1–ILX2<$\gamma 1$, the sequence goes to Step 3.

[Step 3]

Measuring the illuminances at two points $Y_+$ and $Y_-$ on the Y axis.

[Step 4]

Discriminating the difference (non-uniformness) between the illuminances at the points $Y_+$ and $Y_-$. If ILY1–ILY2 $\geq \gamma 2$ (ILY1 is the illuminance at the point $Y_+$, ILY2 is the illuminance at the point $Y_-$ and $\gamma 2$ is the threshold of the illuminance difference with respect to the Y direction), the sequence goes to Step 4' and the position of the light source 1 is displaced and adjusted in the Y direction. If, ILY1–ILY2<$\gamma 2$, the sequence goes to Step 5.

[Step 5]

Measuring the illuminances at two points $X_+$ and $X_-$ on the X axis.

[Step 6]

Discriminating the difference (non-uniformness) between the illuminances at the points $X_+$ and $X_-$. If ILX21–ILX22$\geq \gamma 3$ (ILX21 is the illuminance at the point $X_+$, ILX22 is the illuminance at the point $X_-$ and $\gamma 3$ is the threshold of the illuminance difference with respect to the X direction), the sequence goes to Step 6' and the position of the light source 1 is displaced and adjusted in the X direction. If ILX21–ILX22<$\gamma 3$, the sequence goes to the end and the adjustment is finished.

While in this embodiment both the illuminance and the asymmetric illuminance non-uniformness are corrected, only the illuminance or the illuminance non-uniformness may be corrected.

If only the illuminance correction is desired, only the adjustment of the position of the light source in the Z direction is necessary. Thus, the mechanism is simpler. For such an illuminance adjustment, the measuring device 10 may be used in place of the measuring device 18.

Figure 7:
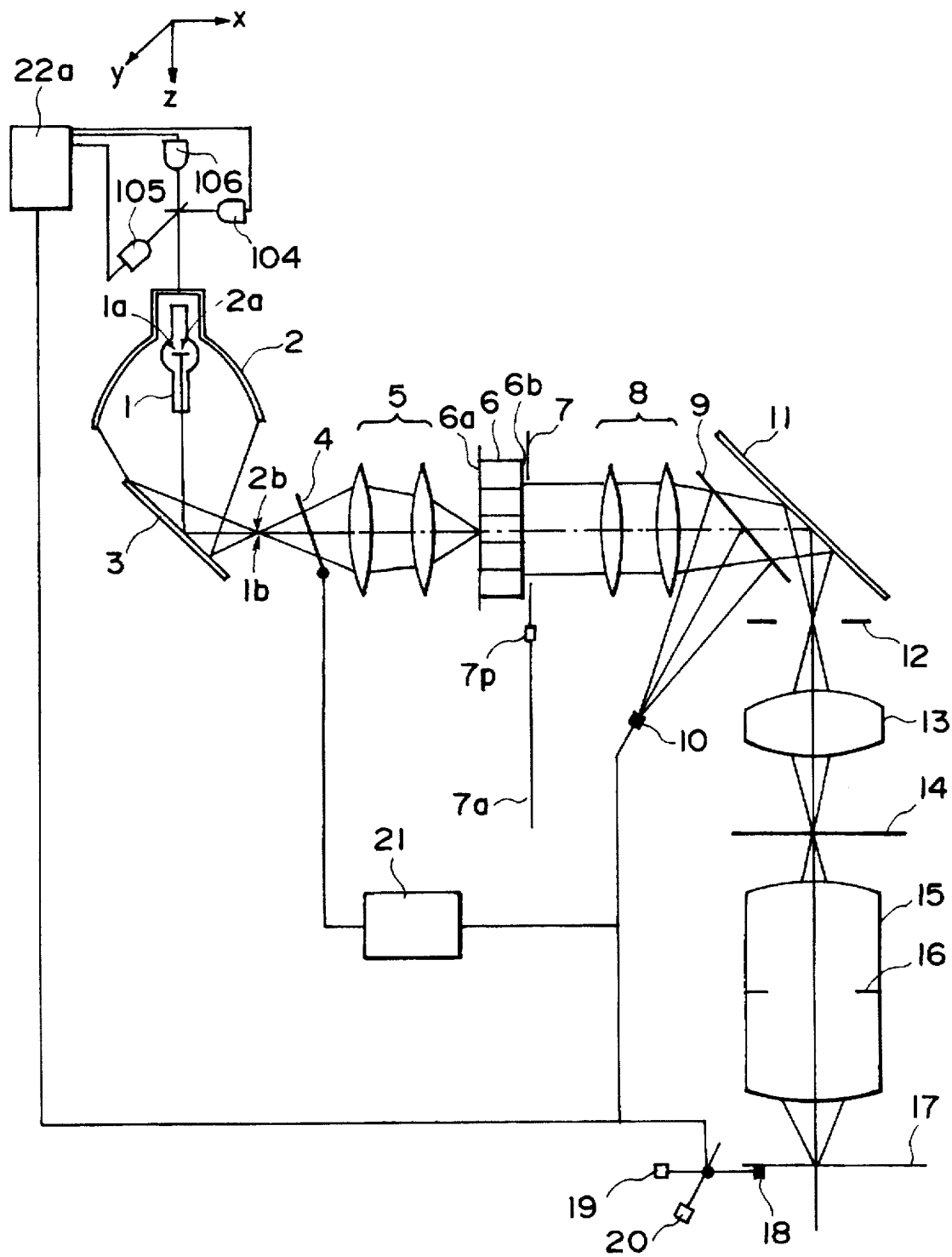
FIG. 7 is a schematic view of a main portion of a projection exposure apparatus according to a second embodiment of the present invention.

FIG. 7 is a schematic view of a main portion of a second embodiment of the present invention.

In the first embodiment described above, the illuminance and the illuminance non-uniformness are adjusted by adjusting the position of the light source 1. This adjustment directly corresponds to changing the light intensity distribution of the light source image 1b of the light emitting portion 1a in the vicinity of the second focal point 2b of the elliptical mirror 2 as well as that of the image of the light source image 1b formed on the light entrance surface 6a.

In consideration of this, in the present embodiment, the elliptical mirror 2 is moved to change the light intensity distribution of the light source image 1b of the light emitting portion 1a in the vicinity of the second focal point 2b of the elliptical mirror 2, with a result of substantially the same advantageous effect.

In FIG. 7, the same reference numerals as those of FIG. 1 are assigned to corresponding elements. An important feature of the present embodiment resides in the position adjusting mechanism of the elliptical mirror 2.

In FIG. 7, denoted at 104 is an actuator for adjusting the position of the elliptical mirror 2 in the X direction. Denoted at 105 is an actuator for adjusting the position of the elliptical mirror 2 in the Y direction. Denoted at 106 is an actuator for adjusting the position of the elliptical mirror 2 in the Z direction (optical axis direction). The initial adjustment of the elliptical mirror 2 is initially done with respect to any one (mode A) of different illumination modes.

If the illumination mode is changed to another (mode B), the illuminance and the illuminance non-uniformness are measured through the measuring device 18. Also, through the control device 22a, the position of the elliptical mirror 2 is adjusted to attain minimum illuminance and minimum illuminance non-uniformness.

The illuminance adjustment is done by moving the elliptical mirror 2 in the Z direction while fixing the detector 18 at an arbitrary position on the image plane (e.g., the center of the exposure region), to determine the maximum illuminance point.

In this case, the measuring device 10 may be used to measure the illuminance, in place of using the measuring device 18. The illuminance adjustment sequence is substantially the same as that of the first embodiment. The adjustment of illuminance non-uniformness is based on adjustment of the elliptical mirror 2 in the X and Y directions, and the sequence of it is substantially the same as that of the first embodiment.

While in this embodiment both the illuminance and the asymmetric illuminance non-uniformness are corrected, only the illuminance or the illuminance non-uniformness may be corrected. If only the illuminance correction is desired, only the adjustment of the position of the elliptical mirror 2 in the Z direction is necessary. Thus, the mechanism is simpler. For such an illuminance adjustment, the measuring device 10 may be used in place of the measuring device 18.

Figure 8:
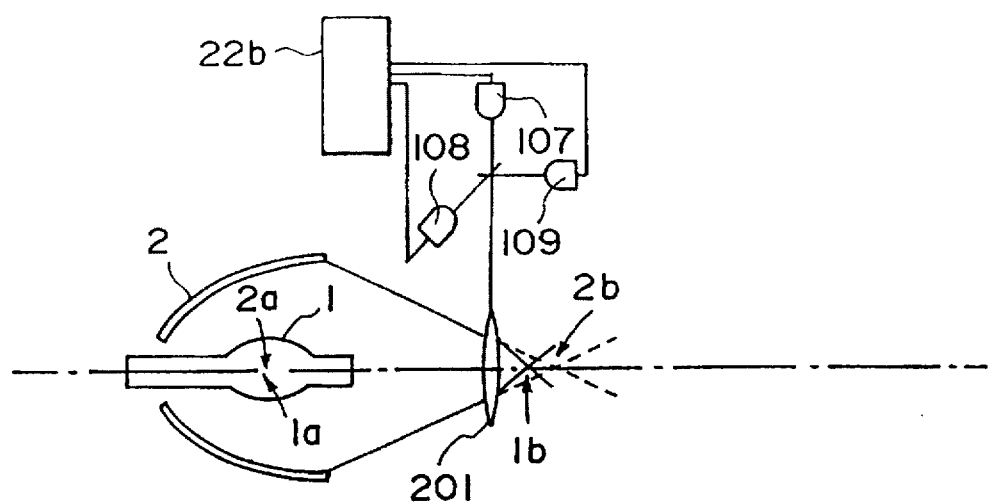
FIG. 8 is an enlarged view of a portion of a projection exposure apparatus according to a third embodiment of the present invention.

FIG. 8 is a schematic view of a main portion, adjacent to a light source i, of a third embodiment of the present invention. In FIG. 8, the same reference numerals as those of FIG. 1 are assigned to corresponding elements. The portion of this embodiment not illustrated has substantially the same structure as that of the corresponding portion of the FIG. 1 embodiment.

In FIG. 8, denoted at 1 is a light source such as a Hg lamp, for example, for emitting ultraviolet rays. Denoted at 2 is an elliptical mirror having a first focal point 2a. The light source 1 has a light emitting portion (electrode) 1a which is disposed in the vicinity of the first focal point 2a. The elliptical mirror 2 and a lens 201 serve to form a light source image 1b, including an image of the light emitting portion 1a, in the vicinity of a second focal point 2b of the elliptical mirror. The optical arrangement following this light source image 1b is of substantially the same structure as the first embodiment, and thus description thereof is omitted here.

Denoted at 107-109 is an adjusting mechanism for the lens 201. More specifically, denoted at 107 is an actuator for adjusting the position of the lens 201 in the X direction, denoted at 108 is an actuator for adjusting the position of the lens 201 in the Y direction, and denoted at 109 is an actuator for adjusting the position of the lens 201 in the Z direction.

The initial adjustment of the lens 201 is initially done with respect to any one (mode A) of different illumination modes. If the illumination mode is changed to another (mode B), the illuminance and the illuminance non-uniformness are measured through a measuring device 18, similar to the one used in the first embodiment. Also, through a control device 22b of FIG. 8, the position of the lens 201 is adjusted to attain maximum illuminance and minimum illuminance non-uniformness. The illuminance adjustment as well as its sequence are substantially the same as that of the first embodiment. The illuminance non-uniformness adjustment and its sequence are based on the adjustment of the lens 201 in the X and Y directions, this being done substantially in the same manner as in the first embodiment.

In FIG. 8, the lens 201 adjacent to the second focal point 2b is used to change the position of the light source image 1b of the light emitting portion 1a. However, a reflection optical system having a mirror may be used in place of the refraction optical system having the lens 201.

While in this embodiment both the illuminance and the asymmetric illuminance non-uniformness are corrected, only the illuminance or the illuminance non-uniformness may be corrected. On this occasion, only the adjustment of the position of the light source in the Z direction is necessary. Thus, the mechanism is simpler. For such an illuminance adjustment, the measuring device 10 (FIG. 1) may be used in place of the measuring device 18.

Figure 9A:
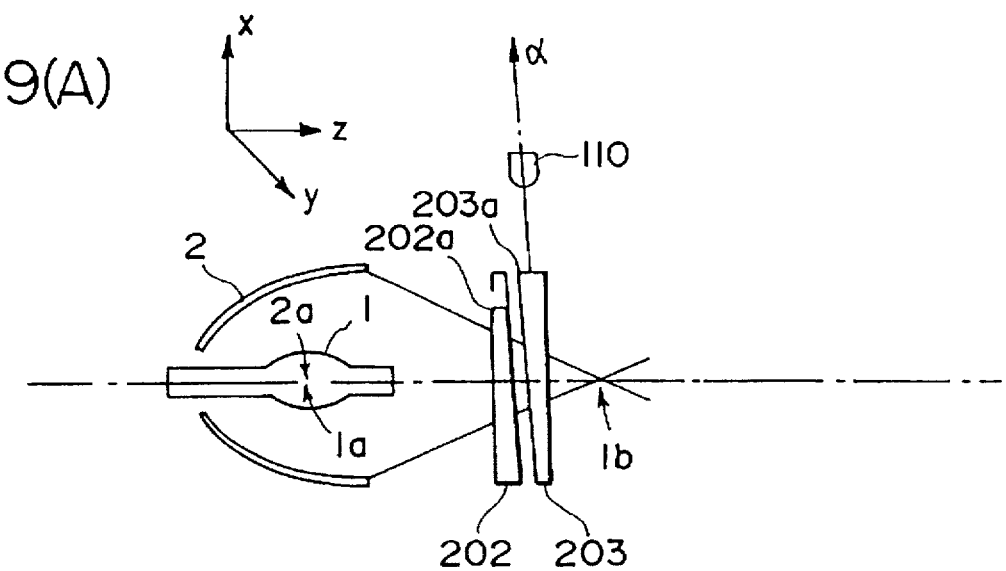
FIGS. 9(A) and 9(B) are enlarged views, respectively, of a portion of a projection exposure apparatus according to a fourth embodiment of the present invention.

FIG. 9(A) is a schematic view of a main portion, adjacent to a light source 1, of a fourth embodiment of the present invention. In FIG. 9(A), the same reference numerals as those of FIG. 1 are assigned to corresponding elements. The portion of this embodiment not illustrated has substantially the same structure as that of the corresponding portion of the FIG. 1 embodiment.

This embodiment uses wedges 202 and 203 in place of the lens 201 of the third embodiment of FIG. 8, to change the light intensity distribution of the light source image 1b of the light emitting portion 1a in the vicinity of the second focal point 2b of the elliptical mirror 2, with a result of substantially the same advantageous effect as that of the first embodiment.

Figure 9B:
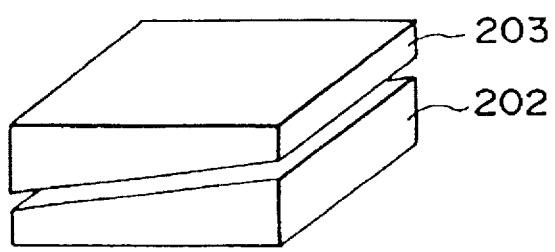

FIG. 9(B) is an enlarged view of the wedges 202 and 203 of FIG. 9(A).

For illuminance correction in this embodiment, an actuator 110 moves the wedge 203 in the direction of the α axis, along the slants 202a and 203a of the wedges 202 and 203. The motion of the wedge 203 in the positive direction along the α axis (the direction of the arrow) causes a decrease in optical thickness, such that the light source image 1b of the light emitting portion 1a shifts in the negative direction along the Z axis (i.e., toward the light source 1). If the wedge 203 is moved in the negative direction along the α axis, the optical thickness increases such that the light source image 1b of the light emitting portion 1b shifts in the positive direction along the Z axis.

By displacing the position of the light source image 1b of the light emitting portion 1a along the optical axis, an optimum illuminance is obtainable. In place of moving the wedge 203, in this embodiment, the wedge 202 or both of the wedges 202 and 203 may be displaced.

Further, the wedge may be rotationally displaced about the X and/or Y axis to correct asymmetric illuminance non-uniformness.

In the first to fourth embodiments described above, the position of an appropriate element or elements is adjusted in accordance with an output of the measuring device 18. However, the relationship between each illumination mode (aperture shape) and the optimum position of the or each element may be determined beforehand, such that the or each element may be displaced accurately to the predetermined position automatically in response to the change of the illumination mode.

Figure 10:
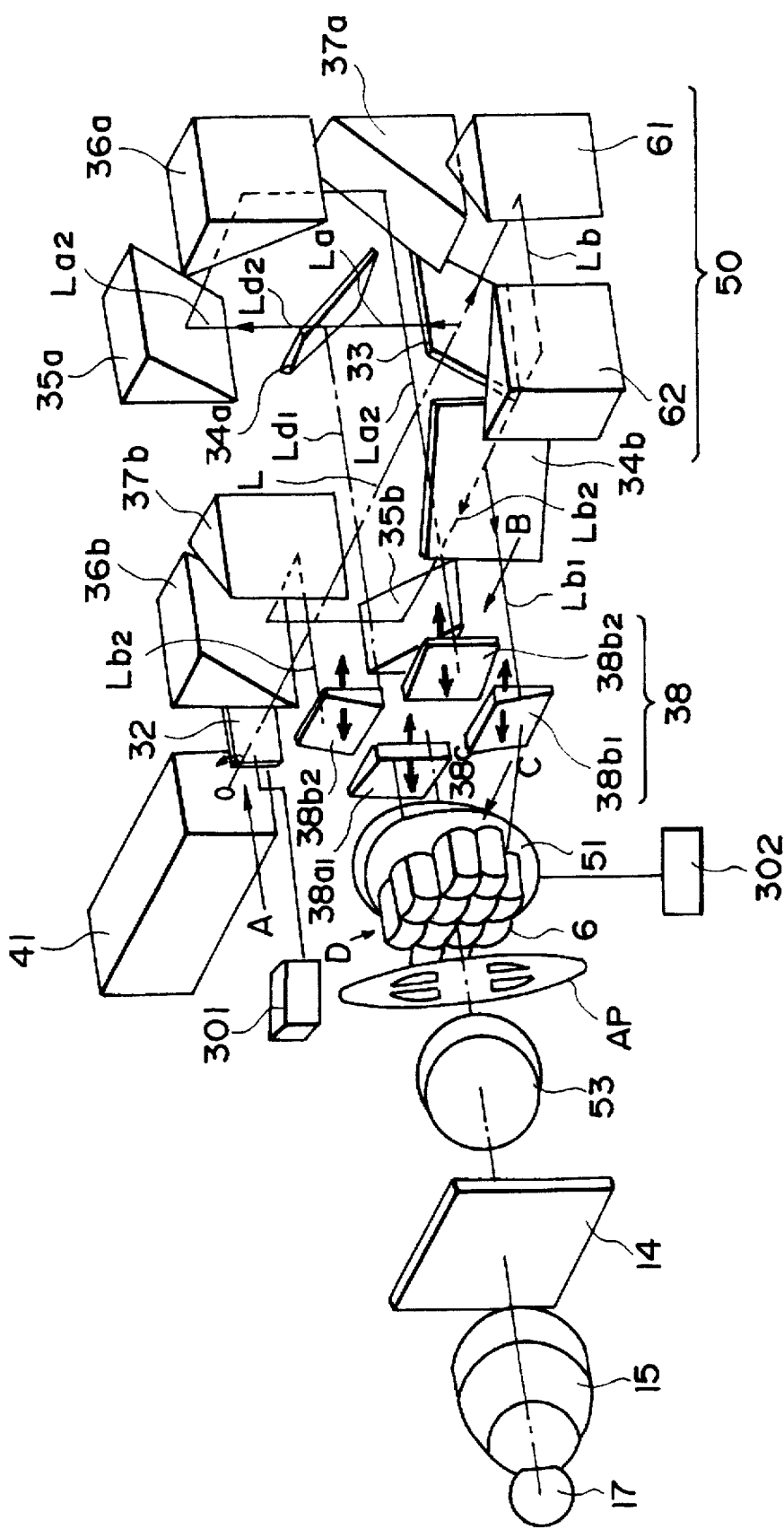
FIG. 10 is a schematic view of a main portion of a projection exposure apparatus according to a fifth embodiment of the present invention.

FIG. 10 is a schematic view of a main portion of a fifth embodiment of the present invention. Also, in this embodiment, the illumination system of the present invention is incorporated into a reduction projection exposure apparatus, called a stepper. In the drawing, denoted at 41 is a light source which comprises a KrF excimer laser having a relatively small spatial coherency (larger number of lateral modes). The light source 41 produces coherent parallel light.

Denoted at 32 is an optical member which comprises a transparent parallel plate. This optical member is pivotally movable to cause translation of the light from the light source 41. Denoted at 33 is a first beam splitter for amplitude-dividing the coherent light, passing through the optical member 32, into two light beams (reflected light and transmitted light) La and Lb. The light beam La reflectively divided by the first beam splitter 33 is again amplitude-divided by a second beam splitter 34a into two light beams (reflected light and transmitted light) La$_1$ and La$_2$. Of these light beams, the reflected light beam La$_1$ being reflectively divided impinges on one wedge-shaped prism 38a$_1$ of a first deflecting member 38. The first deflecting member 38 comprises four wedge-shaped prisms 38a$_1$, 38a$_2$, 38b$_1$ and 38b$_2$, and it serves to refractively deflect received plural lights and to superpose them one upon another. Each of the four wedge-shaped prisms 38a$_1$–38b$_2$ is movable along the optical axis direction (as denoted by arrows) independently from the others. By moving an appropriate one or ones of these prisms, illuminance distribution (asymmetric illuminance non-uniformness) upon a reticle 14 surface or a wafer 17 surface to be produced in response to the change of the aperture shape of the aperture stop can be adjusted. Illuminance distribution adjusting means is thus provided.

The transmitted light La$_2$ being transmissively divided by the second beam splitter 34a is reflected sequentially by reflection mirrors 35a, 36a and 37a, and it is projected on one wedge-shaped prism 38a$_2$ of the first deflecting member 38, with its section being rotated by 180 deg. with respect to the light beam La$_1$.

On the other hand, the transmitted light Lb being transmissively divided by the first beam splitter 33 is reflected by reflection mirrors 61 and 62, and then it is again amplitude-divided by a third beam splitter 34b into two light beams (reflected light and transmitted light) Lb$_1$ and Lb$_2$.

Of these light beams, the reflected light Lb$_1$ being reflectively divided impinges on one wedge shaped prism 38b$_1$ of the first deflecting member 38. Also, the transmitted light Lb$_2$ being transmissively divided by the third beam splitter 34b is reflected sequentially by reflection mirrors 35b, 36b and 37b, and it is projected on one wedge shaped prism 38b$_2$ of the first deflecting member 38 with its section being rotated by 180 deg. with respect to the light beam Lb$_1$.

The four light beams La$_1$, La$_2$, Lb$_1$ and Lb$_2$ incident on the first deflecting member 38 are refractively deflected by the wedge shaped prisms 38a$_1$, 38a$_2$, 38b$_1$ and 38$_2$, respectively, and then they pass through a second deflecting member 51 which comprises a wedge-shaped prism. The lights passing the second deflecting member are projected on a light entrance surface of an optical integrator 6, while being superposed one upon another. The optical integrator 52 comprises a plurality of bar lenses. Here, the four light beams La$_1$, La$_2$, Lb$_1$ and Lb$_2$ are mutually incoherent, to be described later. The second deflecting member 51 is made rotatable about the optical axis of a condenser lens 53.

A secondary light source plane is defined at the light exit surface side of the optical integrator 6, and a number of light spots is formed on that plane, the number being determined by the number of the bar lenses constituting the optical integrator and the number of light beams impinging on the integrator.

Denoted at AP is an aperture stop (stop) which is disposed at the light exit surface side of the optical integrator 6. As an example, it has an aperture for quadruple illumination such as illustrated in FIG. 2(D). The stop AP is defined at the pupil position, and it is optically conjugate with the pupil of the projection lens system 15.

The lights from the light exit surface of the optical integrator 6 pass through the stop AP and they are collected by a condenser lens 53 to illuminate a reticle 14.

Then, through the projection lens system 15, a circuit pattern of the reticle 14 is projected on a wafer 17 in a reduced scale, with a predetermined magnification.

In this embodiment, the first, second and third beam splitters 33, 34a and 34b constitute a light dividing means, while on the other hand, the optical elements disposed along the optical path from the first beam splitter 33 to the first deflecting member 38, inclusive, cooperate with each other to provide an optical means 50 effective to transform one coherent light into four mutually incoherent lights.

FIGS. 11(A)–11(E) are schematic views, respectively, illustrating light intensity distributions on the sections of light at positions denoted by arrows A–D in FIG. 10 and that on the reticle 14 surface, respectively.

Figure 12:
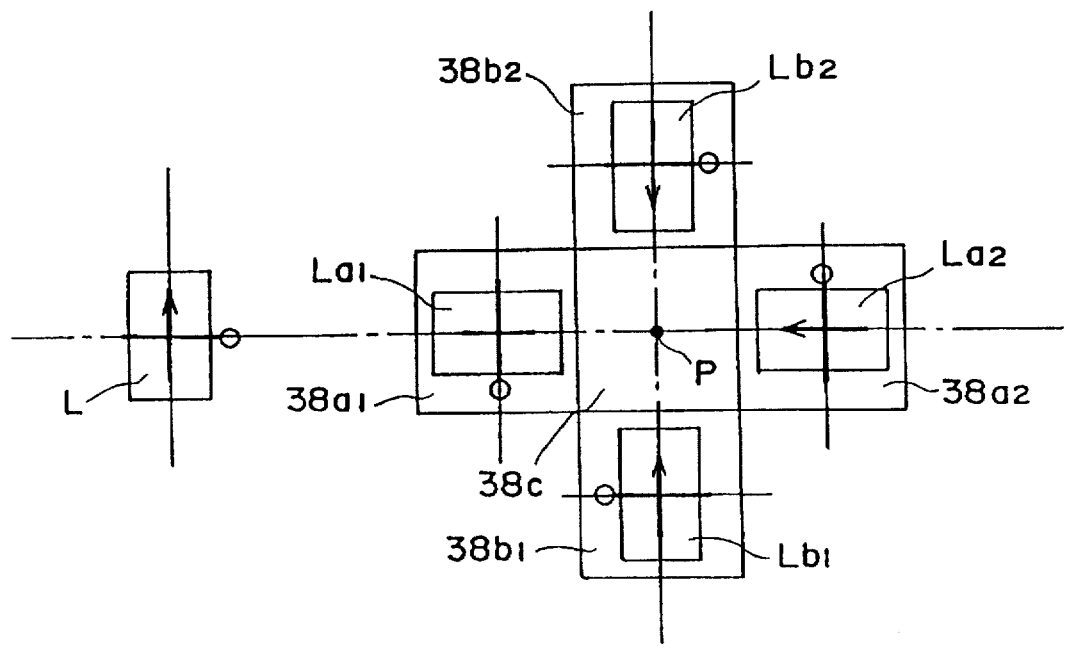
FIG. 12 is a schematic view for explaining the rotation of four lights in the fifth embodiment.

In this embodiment, if the reference orientation of the section of light emitted by the light source 41 is denoted by L (FIG. 12), the orientations of the light beams La$_1$, La$_2$, Lb$_1$ and Lb$_2$ impinging on the wedge shaped prisms 38a$_1$, 38a$_2$, 38b$_1$ and 38b$_2$ are put radially about a reference point P (coinciding with the optical axis of the condenser lens 53) such as illustrated in FIG. 12. FIG. 12 illustrates the sections of the four light beams La$_1$, La$_2$, Lb$_1$ and Lb$_2$, impinging on the first deflecting member 38, as viewed from the wafer 17 side.

From the first beam splitter 33 to the first deflecting member 38, the four light beams La$_1$, La$_2$, Lb$_1$ and Lb$_2$ impinging on the wedge shaped prisms of the first deflecting member 38 have mutually different optical lengths. The corresponding optical elements are so set that the difference becomes larger than the coherent length l with respect to time as determined by the bandwidth of the light source 41.

In this embodiment, the optical lengths of the light beams $La_1$, $La_2$, $Lb_1$ and $Lb_2$ are set to satisfy the relations:

$$Lb_2 > La_2 > Lb_1 > La_1$$

and $$Lb_2 - La_2 = La_2 - Lb_1 = Lb_1 - La_1 = l$$

Mutual incoherency of the four light beams is attained in this manner, such that, when they are superposed one upon another on the light entrance surface of the optical integrator 6, substantially no interference is caused.

In this embodiment, the four light beams $La_1$, $La_2$, $Lb_1$ and $Lb_2$ impinging on the first deflecting member 38 have energies of substantially the same strength.

If the number of beam splitters used is $2^i-1$ (i=2, 3, 4, ..., n) and the number of lights to be divided by the light dividing means 50 is $2^i$ (i=2, 3, 4, ..., n), each of the reflectivity and the transmissivity of the beam splitter is about 50%. If beam splitters or divided light beams of a different number are to be used, the proportion of the reflectivity and the transmissivity of the beam splitter should be adjusted to maintain, even, the energy intensities of the light beams impinging on the first deflecting member 38, so as not to produce illuminance non-uniformness and effective light source distortion.

It is to be noted here that, as a matter of course, the first deflecting member 38 should have wedge shaped prisms of a number corresponding to the number of lights to be divided.

Usually, an excimer laser such as used in this embodiment as a light source has a relatively small spatial coherency. However, in this embodiment, in order to minimize chromatic aberration to be produced by the projection lens 54, a band-narrowing element such as an etalon or a prism, for example, is used to extraordinarily narrow the wavelength range (bandwidth) of the laser light. Thus, the spatial coherency with respect to time is large.

In this embodiment, of the light produced by an excimer laser, the light having a center wavelength $\lambda=248.4$ nm and a wavelength range $\Delta\lambda=0.003$ nm is used. Thus, the coherence length with respect to time of the light beams $La_1$, $La_2$, $Lb_1$ and $Lb_2$ are relatively large.

As a result, when predetermined optical path length differences are applied to these light beams by the light dividing means 50 so that mutually incoherent light beams are projected upon and superposed one upon another on the light entrance surface of the optical integrator 6 through refractive deflection by the first deflecting member 38, no interference fringe is produced due to the interference of these light beams.

Further, the second deflecting member 51 comprising a wedge shaped prism is rotated by driving means 302 about the optical axis of an optical system, comprising the condenser lens 53 and the projection lens system 54, so as to change, with time, the incidence angle and the incidence position of each of the four light beams $La_1$, $La_2$, $Lb_1$ and $Lb_2$ passing the second deflecting member 51, upon the light entrance surface of the optical integrator 6.

The first and second deflecting members 38 and 51 are so disposed that the light beams $La_1$, $La_2$, $Lb_1$ and $Lb_2$ are always and partially superposed one upon another on the light entrance surface of the optical integrator 6.

Figures 11A, 11B, 11C, 11D, 11E:
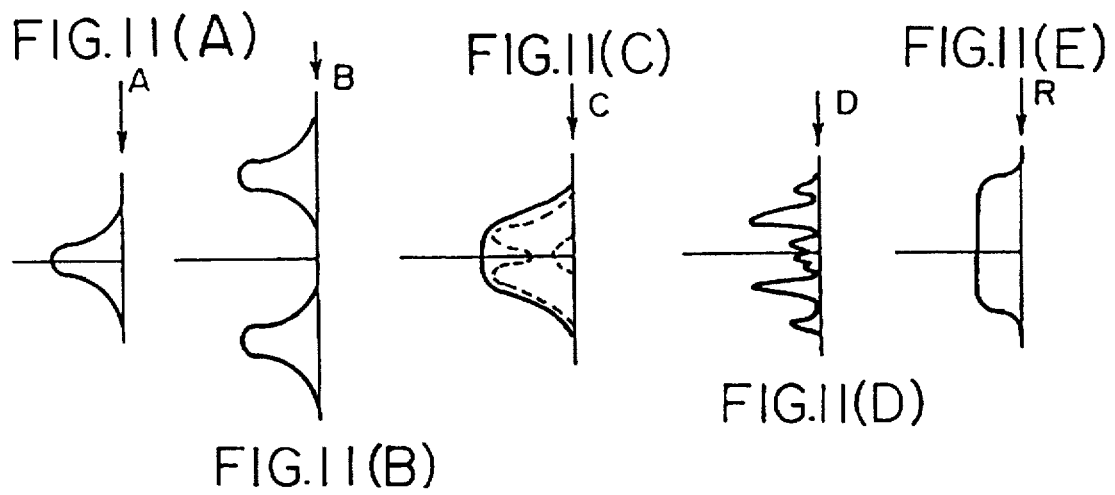
FIGS. 11(A)–11(E) are schematic views, respectively, each showing a sectional light intensity distribution of the fifth embodiment.

As illustrated in FIG. 11(A), the sectional intensity distribution of the laser light from the laser 41 has a Gaussian distribution shape or a shape close to it. Thus, as shown in FIG. 11(B), the sectional intensity distribution of each of the lights $La_1$, $La_2$, $Lb_1$ and $Lb_2$ impinging on the first deflecting member 38 has a substantially Gaussian distribution shape. The sectional light intensity distribution as provided when the light beams $La_1$, $La_2$, $Lb_1$ and $Lb_2$ are projected on and superposed one upon another on the light entrance surface of the optical integrator 6, is symmetric with respect to the optical axis and substantially uniform, such as shown in FIG. 11(C). This is due to the effect of partial superposition of the light beams $La_1$, $La_2$, $Lb_1$ and $Lb_2$ upon the light entrance surface of the optical integrator 6 as described hereinbefore. Further, the light intensity distribution in the vicinity of the light exit surface (plane D) of the optical integrator 6 is such as shown in FIG. 11(D). Even if the sectional intensity distribution on the plane B of each of the light beams $La_1$, $La_2$, $Lb_1$ and $Lb_2$ has a shape other than the Gaussian distribution shape, the light beams $La_1$, $La_2$, $Lb_1$ and $Lb_2$ should desirably be superposed one upon another on the light entrance surface of the optical integrator 6 so as to make uniform the intensity distribution on the light entrance surface (plane C) of the optical integrator 6.

In this embodiment, as illustrated in FIG. 12, the orientations of the four light beams $La_1$, $La_2$, $Lb_1$ and $Lb_2$ on the first deflecting member 38 are put radially about the reference point P. Also, the relative positional relationship between these light beams and the light L as emitted from the light source 41 is such that: as the light L shifts in the direction of arrow (↑), the four light beams $La_1$, $La_2$, $Lb_1$ and $Lb_2$ displace toward the reference point P as depicted by arrows (↑) and symbols (⇟). This assures that, when the optical member 32 comprising a parallel plate is tilted by driving means 301 with respect to the optical axis to cause translation of the light L with respect to the optical axis, the four light beams $La_1$, $La_2$, $Lb_1$ and $Lb_2$ on the optical integrator displace toward or away from the center (reference point P) such that the light intensity distribution on the optical integrator provided by these light beams changes. This change causes a change in the intensity distribution on the secondary light source plane as defined at the light exit surface of the optical integrator 6. In accordance with exposure conditions such as the type of a resist or the linewidth of the circuit pattern of a reticle used, for example, the σ value of the apparatus is changed appropriately through the driving means 301, whereby the exposure process under optimized conditions is assured.

Further, since the arrows of the four light beams $La_1$, $La_2$, $Lb_1$ and $Lb_2$ are oriented inwardly (upwardly, downwardly, leftwardly and rightwardly) as depicted in FIG. 12, the shape of a beam profile as these beams are superposed one upon another becomes substantially flat. Thus, illuminance non-uniformness can be reduced more effectively.

In this embodiment, usually the uniformness of the illuminance distribution upon the reticle 14 is proportional to the uniformness of the light intensity distribution upon the light entrance surface of the optical integrator 6 and to the number of lens elements constituting the optical integrator 6. On the other hand, in a case where coherent light beams such as beams $La_1$, $La_2$, $Lb_1$ and $Lb_2$ are projected on the optical integrator 6: with a larger number of lens elements on which a particular light beam impinges, a larger number of mutually coherent light spots can be formed in the vicinity of the light exit surface of the optical integrator 6: thus, there is a higher possibility of production of interference fringe of high contrast on the reticle 14 surface, due to the interference of the coherent lights from these light spots. Since the optical integrator 6 functions to divide the wavefront of incident light, the contrast of the interference fringe is determined by the degree of spatial coherency of the laser 41.

In this embodiment, as the laser 41, one having a small spatial coherency is used and, in place of increasing the number of the lens elements of the optical integrator 6, each of the light beams $La_1$, $La_2$, $Lb_1$ and $Lb_2$ are projected on some of the lens elements to thereby increase the number of light spots to prevent deterioration of uniformness of the illuminance distribution on the reticle 14 surface due to the interference fringe. Further, since the light beams $La_1$, $La_2$, $Lb_1$ and $Lb_2$ are projected to the optical integrator 6 along different directions, low contrast interference fringes formed on the reticle 14 by the light beams $La_1$, $La_2$, $Lb_1$ and $Lb_2$ have mutually different phases. As a result, the light intensity distribution as determined by these interference fringes is smoothed, and it does not put a large effect on the illuminance distribution on the reticle 14 surface.

Further, in the present embodiment, the second deflecting member 51 is rotated to change the incidence angle and the incidence position of each of the light beams $La_1$, $La_2$, $Lb_1$ and $Lb_2$ upon the optical integrator 6. Consequently, the light intensity distribution on the light entrance surface of the optical integrator 6 has a shape resulting from superposition of some light intensity distributions produced sequentially. Thus, better uniformness is assured. Here, since the distribution itself of secondary light source (effective light source) produced in the vicinity of the light exit surface of the optical integrator by the light beams $La_1$, $La_2$, $Lb_1$ and $Lb_2$ changes with time, the number of light spots increases substantively.

The excimer laser 41 is a pulse laser, and it emits pulses of laser light with predetermined time intervals. If the number of pulses necessary for exposure (printing) of a resist layer of the wafer 17 to the circuit pattern of the reticle 14 is denoted by M, and if the second deflecting member 51 is rotated continuously during the exposure process, the light intensity distribution on the light entrance surface of the optical integrator 6 has a shape resulting from superposition of light intensity distributions of a number M. Further, if secondary light sources of a number N are produced per one pulse by the light beams $La_1$, $La_2$, $Lb_1$ and $Lb_2$, then the wafer is exposed with lights from the secondary light sources of a number M×N.

Next, the optical arrangement following the optical integrator 6 will be explained.

Condenser lens 53 comprises a lens assembly having plural lens elements arrayed along the optical axis. It serves to direct, toward the reticle 14, the lights from a number of light spots at the stop AP position formed in the vicinity of the light exit surface of the optical integrator 6. The large number of light spots are distributed along a plane perpendicular to the optical axis of the condenser lens 53. The distance from this plane (secondary light source forming plane) to the principal plane at the light entrance side (front side) of the condenser lens 53 is equal to the focal length of the condenser lens 53. On the other hand, the distance between the reticle 14 and the principal plane at the light exit side (rear side) of the condenser lens 53 is set to be equal to the focal length of the condenser lens 53. With this structure, the lights from the large number of secondary light sources are transformed by the condenser lens 53 into parallel lights and they are superposed one upon another efficiently on the reticle 14. Here, the illuminance distribution on the reticle 14 is uniform such as depicted in FIG. 11E.

The projection lens system 15 comprises a lens assembly having a plurality of lenses arrayed along the optical axis. It serves to place the circuit pattern surface of the reticle 14 and the surface of the wafer 17 to be exposed, in an optically conjugate relationship. In this embodiment, the projection lens system 15 is arranged to project an image of the circuit pattern of the reticle 14 upon the wafer 17 in a reduction magnification of 1:5. The entrance pupil of the projection lens system 15 is placed in an optically conjugate relation with the secondary light source in the vicinity of the light exit surface of the optical integrator 6, and the wafer 17 is illuminated in a Koehler illumination manner, like the reticle 14.

Further, the optical integrator 6 and the condenser lens 53 are arranged so that the light entrance surface of the optical integrator 6 and the circuit pattern surface of the reticle 14 are optically conjugate with each other.

In the illumination device of this embodiment, an excimer laser 41 having a small spatial coherency is used as a light source and, through the optical means 50, mutually incoherent light beams $La_1$, $La_2$, $Lb_1$ and $Lb_2$ are projected on the light entrance surface of the optical integrator 6 along different directions and superposed one upon another on that surface. As a result, a large number of light spots can be formed in the vicinity of the light exit surface of the optical integrator 6. Thus, it is possible to provide an effective light source having densely distributed light spots. For this reason, superior illumination of the reticle circuit pattern and accurate projection of the circuit pattern image of the reticle upon the wafer are assured.

Since the optical means 50 serves to amplitude divide the laser light from the excimer laser 41 to produce plural light beams, the structure of the optical system becomes simple as compared with an optical system wherein the laser light is wavefront-divided.

As the position of the second rotatable deflecting member 51, it may be disposed between the laser 41 and the optical integrator 6. Also, if there is a large diffraction loss of light in the optical path within the optical means, an imaging system such as an afocal converter, for example, may be provided on the optical path to assure efficient transmission of the light beams $La_1$, $La_2$, $Lb_1$ and $Lb_2$ to the optical integrator 6. Such an imaging optical system may be disposed so as to place the light passing surfaces of predetermined elements, constituting the optical means 50, in a mutually optically conjugate relationship.

In this embodiment, the first deflecting member 38 comprises transmission type wedge-shaped prisms. However, it may comprise a reflection type deflecting member having plural mirrors corresponding to the light beams, respectively. On that occasion, a driving means may be provided to drive each mirror independently of the others.

In this embodiment, the change of illumination mode is made by changing the stop AP of FIG. 10 (i.e., by changing the aperture shape). The illuminance non-uniformness may change in response to the change of illumination mode. In this embodiment, the wedge-shaped prisms $38a_1$, $38a_2$, $38b_1$ and $38b_2$ are moved along the optical axis direction, independently of each other, toward predetermined positions or while monitoring the output of a measurement device, not shown, to thereby reduce the illuminance non-uniformness.

As illustrated in FIG. 11(C), the light beams $La_1$, $La_2$, $Lb_1$ and $Lb_2$ are superposed one upon another by the wedge-shaped prisms $38a_1$, $38a_2$, $38b_1$ and $38_2$. Moving these wedge-shaped prisms causes a change in shape of the light intensity distribution as provided by the light beams $La_1$, $La_2$, $Lb_1$ and $Lb_2$. The illuminance distribution changes as a result of this. The correction of illuminance non-uniformness is made on the basis of this.

Next, a description will be made of an embodiment of a device manufacturing method of the present invention, wherein a projection exposure apparatus described hereinbefore is used.

Figure 13:
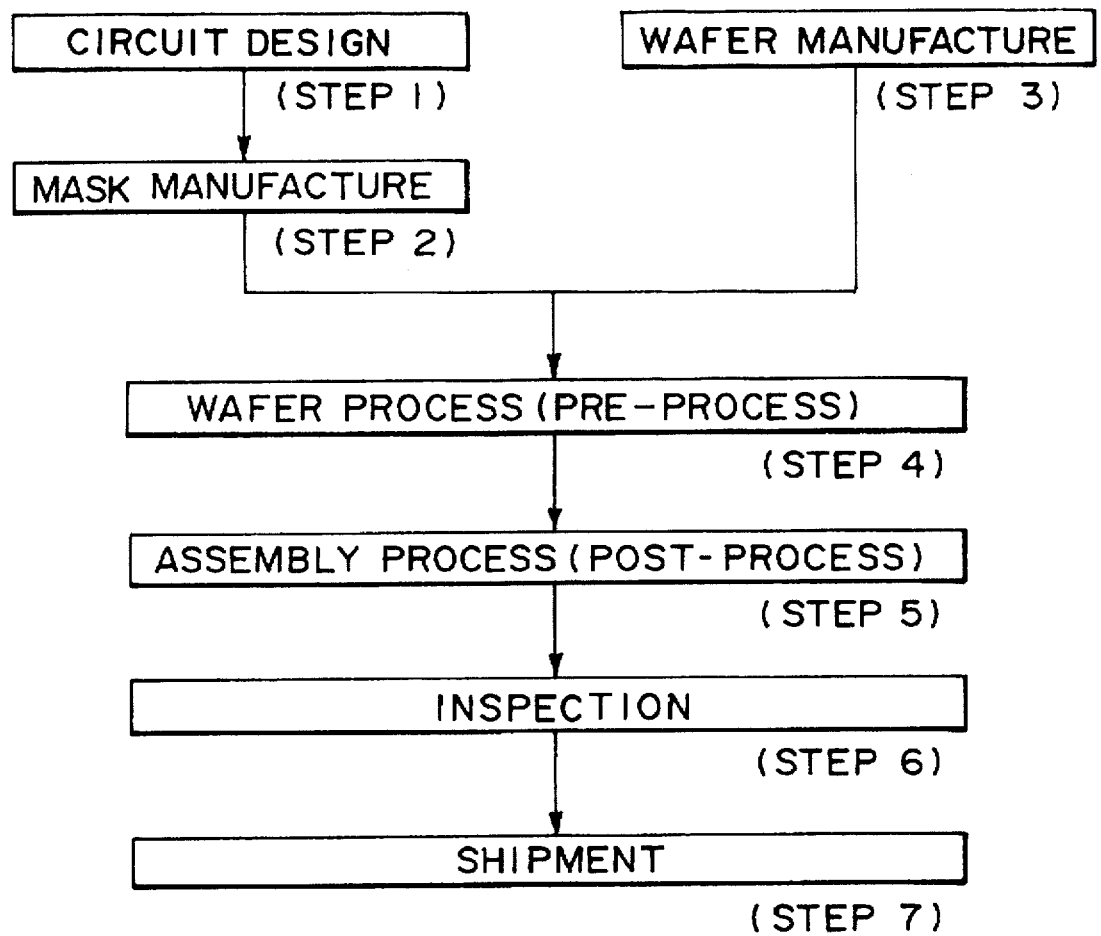
FIG. 13 is a flow chart of device manufacturing processes.

FIG. 13 is a flow chart of the sequence of manufacturing a semiconductor device such as a semiconductor chip (e.g., an IC or an LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5, subsequent to this, is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 14:
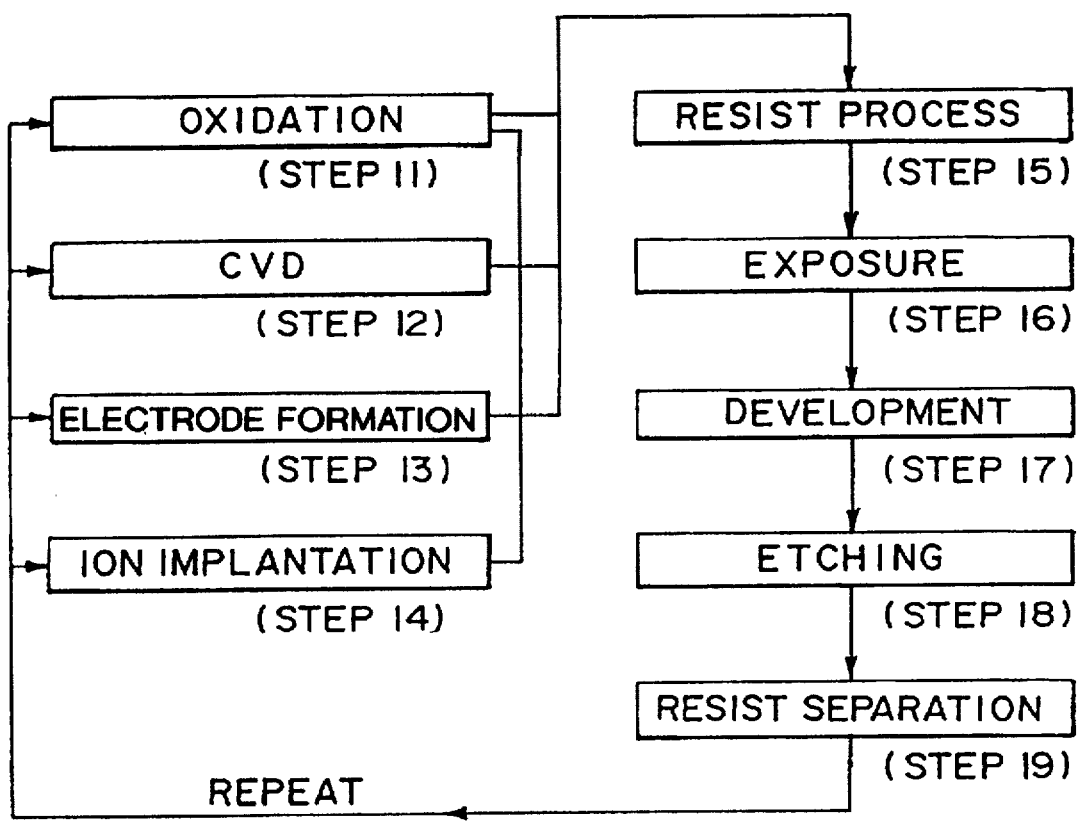
FIG. 14 is a flow chart of a wafer process of the device manufacturing processes.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus comprising:

secondary light source forming means having a light entrance surface and a light exit surface, for receiving light from a light source with the light entrance surface and for forming a secondary light source at the light exit surface side;

light projecting means for projecting light from said secondary light source to an object plane;

pattern projecting means for projecting, onto an image plane, a pattern on the object plane irradiated with the light;

secondary light source adjusting means for changing a light intensity distribution of said secondary light source; and illuminance correcting means for changing an intensity distribution of light from the light source, upon the light entrance surface of said secondary light source forming means, to correct an illuminance distribution, to be formed on the image plane asymmetrically with respect to a center due to a variation in light intensity distribution of said secondary light source, into an illuminance distribution symmetric with respect to the center.

2. An apparatus according to claim 1, wherein said illuminance correcting means comprises means for adjusting an intensity distribution of light from the light source, upon a light entrance surface of said secondary light source forming means.

3. An apparatus according to claim 2, further comprising light source image projecting means for projecting an image of the light source upon the light entrance surface of said secondary light source forming means, wherein said illuminance correcting means comprises light source image displacing means for changing the position of the light source image on the light entrance surface.

4. An apparatus according to claim 3, wherein said light source image displacing means comprises light source position adjusting means for changing the position of the light source on a plane perpendicular to an optical axis.

5. An apparatus according to claim 4, wherein said light source image displacing means comprises light deflecting means for deflecting the light from the light source in a direction perpendicular to the optical axis.

6. An apparatus according to claim 5, wherein said light deflecting means comprises one of an elliptical mirror for reflecting the light from the light source, a movable lens and a transparent plate each for refracting the light from the light source.

7. An apparatus according to claim 6, wherein said transparent plate comprises a plurality of wedge-like plate members.

8. An apparatus according to claim 1, wherein the light source comprises one of a lamp and a laser.

9. An apparatus according to claim 1, wherein said secondary light source forming means comprises a fly's-eye lens.

10. An apparatus according to claim 1, wherein said secondary light source adjusting means comprises an aperture stop having a variable aperture shape.

11. An apparatus according to claim 3, wherein said secondary light source adjusting means comprises a variable-magnification optical system for changing the size of the light source image.

12. An apparatus according to claim 1, wherein said secondary light source adjusting means comprises a light deflecting member for changing the position of incidence of the light from the light source upon a light entrance surface of said secondary light source forming means.

13. An apparatus according to claim 1, wherein said pattern projecting means comprises a projection lens.

14. An apparatus according to claim 1, wherein said pattern projecting means comprises a projection mirror.

15. An apparatus according to claim 1, wherein said illuminance correcting means comprises means for substantively increasing the quantity of light to be projected to the object plane, which quantity is reduced as a result of a change in the light intensity distribution.

16. An apparatus according to claim 1, wherein said illuminance correcting means comprises illuminance detecting means for detecting an illuminance distribution on at least one of the image plane and the object plane.

17. An apparatus according to claim 1, wherein said illuminance correcting means further comprises means for substantively correcting illuminance non-uniformness produced on the image plane due to a change in the light intensity distribution.

18. A projection exposure apparatus, comprising:

light source image projecting means for projecting an image of a light source;

secondary light source forming means having a light entrance surface and a light exit surface, for forming a secondary light source at the light exit surface thereof in response to projection of the light source image on the light entrance surface thereof;

light projecting means for projecting light from said secondary light source onto an object plane;

pattern projecting means for projecting an image of a pattern, placed on the object plane and irradiated with the light, onto an image plane; and secondary light source adjusting means for changing light intensity distribution of said secondary light source, wherein said light source image projecting means comprises illuminance adjusting means for changing the position of the light source image with respect to a direction of an optical axis, so as to reduce a decrease in a quantity of light from said secondary light source caused by a variation in the light intensity distribution of said secondary light source.

19. An apparatus according to claim 18, wherein said illuminance adjusting means comprises means for adjusting an intensity distribution of light from the light source, upon a light entrance surface of said secondary light source forming means.

20. An apparatus according to claim 19, further comprising light source image projecting means for projecting an image of the light source upon the light entrance surface of said secondary light source forming means, wherein said illuminance adjusting means comprises light source image displacing means for changing the position of the light source image on the light entrance surface.

21. An apparatus according to claim 20, wherein said light source image displacing means comprises light source position adjusting means for changing the position of the light source on a plane perpendicular to an optical axis.

22. An apparatus according to claim 20, wherein said light source image displacing means comprises light deflecting means for displacing the light source image in a direction of the optical axis.

23. An apparatus according to claim 22, wherein said light deflecting means comprises one of an elliptical mirror for reflecting the light from the light source, a movable lens and a transparent plate each for refracting the light from the light source.

24. An apparatus according to claim 23, wherein said transparent plate comprises a plurality of wedge-like plate members.

25. An apparatus according to claim 18, wherein the light source comprises one of a lamp and a laser.

26. An apparatus according to claim 18, wherein said secondary light source forming means comprises a fly's-eye lens.

27. An apparatus according to claim 18, wherein said secondary light source adjusting means comprises an aperture stop having a variable aperture shape.

28. An apparatus according to claim 20, wherein said secondary light source adjusting means comprises a variable-magnification optical system for changing the size of the light source image.

29. An apparatus according to claim 18, wherein said pattern projecting means comprises a projection lens.

30. An apparatus according to claim 18, wherein said pattern projecting means comprises a projection mirror.

31. An apparatus according to claim 18, wherein said illuminance adjusting means comprises illuminance detecting means for detecting an illuminance distribution on at least one of the image plane and the object plane.

32. An apparatus according to claim 18, wherein said illuminance correcting means comprises means for substantively correcting illuminance non-uniformness produced on the image plane due to a change in the light intensity distribution.

33. A projection exposure apparatus, comprising:

light source image projecting means for projecting an image of a light source;

secondary light source forming means having a light entrance surface and a light exit surface, for forming a secondary light source on the light exit surface thereof in response to projection of the light source image on the light entrance surface thereof;

light projecting means for projecting light from said secondary light source onto an object plane;

pattern projecting means for projecting an image of a pattern, placed on the object plane and irradiated with the light, onto an image plane; and secondary light source adjusting means for changing light intensity distribution of said secondary light source, wherein said light source image projecting means comprises illumination adjusting means for changing an intensity distribution of light upon the light entrance surface of said secondary light source forming means, to correct an illuminance distribution, to be formed on the image plane asymmetrically with respect to a center due to a variation in the light intensity distribution of said secondary light source, into an illuminance distribution symmetric with respect to the center, and also for changing the position of the light source image with respect to a direction of an optical axis, so as to reduce a decrease in a quantity of light from said secondary light source caused by a variation in the light intensity distribution of said secondary light source.

34. An apparatus according to claim 33, further comprising light source image projecting means for projecting an image of the light source upon the light entrance surface of said secondary light source forming means, wherein said illuminance adjusting means comprises light source image displacing means for changing the position of the light source image in a direction along an optical axis and in a direction perpendicular to the optical axis.

35. An apparatus according to claim 34, wherein said light source image displacing means comprises light deflecting means for moving the light source in a direction along the optical axis and in a direction perpendicular to the optical axis.

36. An apparatus according to claim 34, wherein said light source image displacing means comprises light deflecting means for displacing the light source image in a direction along the optical axis and in a direction perpendicular to the optical axis.

37. An apparatus according to claim 36, wherein said light deflecting means comprises one of an elliptical mirror for reflecting the light from the light source, a movable lens and a transparent plate each for refracting the light from the light source.

38. An apparatus according to claim 37, wherein said transparent plate comprises a plurality of wedge-like plate members.

39. An apparatus according to claim 33, wherein the light source comprises one of a lamp and a laser.

40. An apparatus according to claim 33, wherein said secondary light source forming means comprises a fly's-eye lens.

41. An apparatus according to claim 33, wherein said secondary light source adjusting means comprises an aperture stop having a variable aperture shape.

42. An apparatus according to claim 33, wherein said secondary light source adjusting means comprises a variable-magnification optical system for changing the size of the light source image.

43. An apparatus according to claim 33, wherein said pattern projecting means comprises a projection lens.

44. An apparatus according to claim 33, wherein said pattern projecting means comprises a projection mirror.

45. An apparatus according to claim 33, wherein said illuminance adjusting means comprises illuminance detecting means for detecting an illuminance distribution on at least one of the image plane and the object plane.

46. An apparatus according to claim 33, wherein said illuminance correcting means comprises means for substantively correcting illuminance non-uniformness produced on the image plane due to a change in the light intensity distribution.

47. A device manufacturing method comprising:

projecting and transferring a device pattern of a reticle onto a substrate using a projection exposure apparatus, comprising:

secondary light source forming means having a light entrance surface and a light exit surface, for receiving light from a light source with the light entrance surface and for forming a secondary light source at the light exit surface side;

light projecting means for projecting light from the secondary light source to an object plane;

pattern projecting means for projecting, onto an image plane, a pattern on the object plane irradiated with the light;

secondary light source adjusting means for changing a light intensity distribution of the secondary light source; and illuminance correcting means for changing an intensity distribution of light from the light source, upon the light entrance surface of the secondary light source forming means, to correct an illuminance distribution, to be formed on the image plane asymmetrically with respect to a center due to a variation in light intensity distribution of the secondary light source, into an illuminance distribution symmetric with respect to the center.

48. A device manufacturing method comprising:

projecting and transferring a device pattern of a reticle onto a substrate using a projection exposure apparatus, comprising:

light source image projecting means for projecting an image of a light source;

secondary light source forming means having a light entrance surface and a light exit surface, for forming a secondary light source at the light exit surface thereof in response to projection of the light source image on the light entrance surface thereof;

light projecting means for projecting light from the secondary light source onto an object plane;

pattern projecting means for projecting an image of a pattern placed on the object plane and irradiated with the light, onto an image plane; and secondary light source adjusting means for changing a light intensity distribution of the secondary light source, wherein the light source image projecting means comprises illuminance adjusting means for changing the position of the light source image with respect to a direction of an optical axis, so as to reduce a decrease in a quantity of light from the secondary light source caused by a variation in the light intensity distribution of the secondary light source.

49. A device manufacturing method comprising:

projecting and transferring a device pattern of a reticle onto a substrate using a projection exposure apparatus, comprising:

light source image projecting means for projecting an image of a light source;

secondary light source forming means having a light entrance surface and a light exit surface, for forming a secondary light source on the light exit surface thereof in response to projection of the light source image on the light entrance surface thereof;

light projecting means for projecting an image of a pattern, placed on the object plane and irradiated with the light, onto an image plane; and secondary light source adjusting means for changing a light intensity distribution of the secondary light source, wherein the light source image projecting means comprises illuminance adjusting means for changing an intensity distribution of light upon the light entrance surface of the secondary light source forming means, to correct an illuminance distribution, to be formed on the image plane asymmetrically with respect to a center due to a variation in the light intensity distribution of the secondary light source, into an illuminance distribution symmetric with respect to the center, and also for changing the position of the light source image with respect to a direction of an optical axis, so as to reduce a decrease in a quantity of light from the secondary light source caused by a variation in the light intensity distribution of the secondary light source.

* * * * *

UNITED STATES PATENT AND TRADEMARK OFFICE
CERTIFICATE OF CORRECTION

PATENT NO. : 5,726,739

DATED : March 10, 1998

INVENTOR : SHIGERU HAYATA

It is certified that error appears in the above-identified patent and that said Letters Patent is hereby corrected as shown below:

COLUMN 4:

line 4, "tight" should read --light--.

COLUMN 7:

line 17, "2bof" should read --2b of--.

COLUMN 10:

line 14, "$38_2$," should read --$38b_2$,--.

COLUMN 17:

line 17, "light" (second occurrence) should read --a light--.

UNITED STATES PATENT AND TRADEMARK OFFICE
CERTIFICATE OF CORRECTION

PATENT NO. : 5,726,739

DATED : March 10, 1999

INVENTOR : SHIGERU HAYATA

It is certified that error appears in the above-identified patent and that said Letters Patent is hereby corrected as shown below:

COLUMN 18:

```
    line 25, "light" (second occurrence) should read
--a light--.
```

Signed and Sealed this

Twenty-second Day of June, 1999

Attest:

Q. TODD DICKINSON

*Attesting Officer*   Acting Commissioner of Patents and Trademarks